(12) United States Patent
Murray et al.

(10) Patent No.: US 9,282,686 B2
(45) Date of Patent: Mar. 8, 2016

(54) SYSTEM AND METHOD FOR HIGH RESOLUTION, HIGH THROUGHPUT PROCESSING OF CONDUCTIVE PATTERNS OF FLEXIBLE SUBSTRATES

(71) Applicant: Flextronics International USA, Inc., San Jose, CA (US)

(72) Inventors: Galen Murray, Northfield, MN (US); Kevin Corrigan, Burnsville, MN (US); Edward Mahagnoul, Fairbault, MN (US)

(73) Assignee: Flextronics International USA, Inc., San Jose, CA (US)

( * ) Notice: Subject to any disclaimer, the term of this patent is extended or adjusted under 35 U.S.C. 154(b) by 249 days.

(21) Appl. No.: 13/907,740

(22) Filed: May 31, 2013

(65) Prior Publication Data

US 2014/0013566 A1 Jan. 16, 2014

Related U.S. Application Data

(60) Provisional application No. 61/670,055, filed on Jul. 10, 2012.

(51) Int. Cl.
| | |
|---|---|
| *H05K 13/00* | (2006.01) |
| *G06F 3/044* | (2006.01) |
| *H05K 3/46* | (2006.01) |
| *H05K 13/04* | (2006.01) |
| *H05K 1/02* | (2006.01) |

(52) U.S. Cl.
CPC .............. *H05K 13/00* (2013.01); *G06F 3/044* (2013.01); *H05K 3/4638* (2013.01); *H05K 13/0015* (2013.01); *G06F 2203/04103* (2013.01); *H05K 1/0268* (2013.01); *H05K 1/0269* (2013.01); *H05K 13/046* (2013.01); *H05K 13/0452* (2013.01); *H05K 2203/166* (2013.01); *Y10T 29/49126* (2015.01); *Y10T 29/49778* (2015.01); *Y10T 29/53022* (2015.01); *Y10T 29/53174* (2015.01); *Y10T 29/53261* (2015.01)

(58) Field of Classification Search
CPC ................. Y10T 29/49126; Y10T 29/531174; Y10T 29/53261; H01L 25/0657; H01L 2223/54426; H01L 23/544; G06F 3/044; H05K 13/0015; H05K 13/0452; H05K 13/046; G03F 9/00
See application file for complete search history.

(56) References Cited

U.S. PATENT DOCUMENTS

| | | | | | |
|---|---|---|---|---|---|
| 5,388,517 | A | * | 2/1995 | Levien | 101/485 |
| 5,643,699 | A | * | 7/1997 | Waldner | 430/22 |
| 6,188,391 | B1 | * | 2/2001 | Seely et al. | 345/173 |
| 7,283,660 | B2 | * | 10/2007 | Ganot et al. | 382/151 |

(Continued)

*Primary Examiner* — Sarang Afzali
*Assistant Examiner* — Ruth G Hidalgo-Hernandez
(74) *Attorney, Agent, or Firm* — Haverstock & Owens LLP

(57) ABSTRACT

Alignment markers are added to each layer of a multiple layer substrate for proper alignment. Optical alignment markers are applied on the surface of each substrate layer. Groups of alignment markers are arranged in localized areas on each substrate layer. Each localized group of alignment markers are referred to as alignment target areas. The alignment markers in a first alignment target area on the first substrate layer are to be aligned with corresponding alignment markers in a second alignment target area on the second substrate layer. In some embodiments, the first alignment target area includes an alignment marker configured for manual alignment and another alignment marker configured for machine alignment. The second alignment target area has a corresponding manual alignment marker and machine alignment marker.

36 Claims, 4 Drawing Sheets

(56) References Cited

U.S. PATENT DOCUMENTS

| | | |
|---|---|---|
| 2003/0234769 A1 | 12/2003 | Cross et al. |
| 2006/0103033 A1* | 5/2006 | Van Haren et al. ........... 257/797 |
| 2009/0085891 A1 | 4/2009 | Yang et al. |
| 2009/0134496 A1* | 5/2009 | Warrick et al. ............... 257/620 |
| 2009/0160817 A1 | 6/2009 | Wu et al. |
| 2009/0257036 A1* | 10/2009 | Chuang .......................... 355/53 |
| 2010/0026659 A1 | 2/2010 | Long et al. |
| 2010/0039398 A1 | 2/2010 | Lin et al. |

* cited by examiner

SYSTEM AND METHOD FOR HIGH RESOLUTION, HIGH THROUGHPUT PROCESSING OF CONDUCTIVE PATTERNS OF FLEXIBLE SUBSTRATES

RELATED APPLICATIONS

This Patent Application claims priority under 35 U.S.C. 119 (e) of the U.S. Provisional Application, Ser. No. 61/670,055, filed Jul. 10, 2012, and entitled "System and Method for High Resolution, High Throughput Processing of Conductive Patterns of Flexible Substrates". This application incorporates U.S. Provisional Application, Ser. No. 61/670,055 in its entirety by reference.

FIELD OF THE INVENTION

This invention relates to multiple layer substrates and methods of processing multiple layer substrates. More specifically, this invention relates to multiple layer substrates having conductive patterns and methods of processing such substrates.

BACKGROUND OF THE INVENTION

Many electrical devices are incorporating touchscreen type displays. A touchscreen is a display that detects the presence, location, and pressure of a touch within the display area, generally by a finger, hand, stylus, or other pointing device. The touchscreen enables a user to interact with the display panel directly without requiring any intermediate device, rather than indirectly with a mouse or touchpad. Touchscreens can be implemented in computers or as terminals to access networks. Touchscreens are commonly found in point-of-sale systems, automated teller machines (ATMs), mobile phones, personal digital assistants (PDAs), portable game consoles, satellite navigation devices, and information appliances.

There are a number of types of touchscreen technologies. A capacitive touch sensor includes multiple layers coated, partially coated, or patterned with a material that conducts a continuous electrical current. The sensor exhibits a precisely controlled field of stored electrons in both the horizontal and vertical axes to achieve capacitance. The human body is conductive; therefore, influences electric fields stored in a capacitance. When a reference capacitance of the sensor is altered by another capacitance field, such as a finger, electronic circuits located at each corner of the panel measure the resultant distortion in the reference capacitance. The measured information related to the touch event is sent to the controller for mathematical processing.

Capacitive touch sensors are typically formed using transparent conductors, such as ITO (Indium Tin Oxide) conductors, formed in layers. In an exemplary configuration, a first layer is positioned on top of a second layer. The second layer has bottom conductors that form drive electrodes, also referred to as drive lines, and the first layer has top conductors that form sense electrodes, also referred to as sense lines. Each cross-point of a drive line and a sense line forms a capacitor having a measured capacitance. The objective is to determine an estimate of a touch position on the capacitive touch sensor. When a finger, or other object that is grounded, is positioned on or proximate a cross-point of the sensor, there is a change in the measured capacitance at that cross-point.

Manufacturing of touchscreens having capacitive touch sensors requires proper alignment of the multiple layers both laterally and rotationally under high speed processing. Printed targets have been used for registering various assembly operations including layer lamination, laser cutting and excising. FIG. 1 illustrates a conventional printed target. Multiples of these targets are printed in strategic locations of each layer. Targets on each layer are aligned with targets on corresponding layers to form sets of aligned targets, each set including one target from each layer. The aligned targets are then punched by means of an aligning punch system such that a pin is punched through the layers at each set, thereby holding the layers in positioned according to the aligned targets.

SUMMARY OF THE INVENTION

Alignment markers are added to each substrate layer for proper alignment of multiple substrate layers. In some embodiments, each layer is made of a transparent substrate having conductive tracings on one surface. The conductive tracings can be used in a variety of applications, such as capacitive touch sensors. Assembly of multiple layer substrates includes proper alignment of the individual substrate layers relative to each other. Optical alignment markers are applied on the surface of each substrate layer so as not to interfere with the application-specific conductive tracings. Groups of alignment markers are arranged in localized areas on each substrate layer. Each localized group of alignment markers are referred to as alignment target areas. The alignment markers in a first alignment target area on the first substrate layer are to be aligned with corresponding alignment markers in a second alignment target area on the second substrate layer. In some embodiments, the first alignment target area includes an alignment marker configured for manual alignment and another alignment marker configured for machine alignment. The second alignment target area has a corresponding manual alignment marker and machine alignment marker.

In an aspect, an alignment feedback apparatus for aligning multiple substrate layers is disclosed. The apparatus a first substrate and a second substrate. The first substrate layer has a first portion of an alignment target area formed on a surface, wherein the first portion of the alignment target area includes a first manual alignment marker and a first machine alignment marker. The second substrate layer has a second portion of the alignment target area formed on a surface. The second substrate layer is coupled to the first substrate layer. The second portion of the alignment target area includes a second manual alignment marker and a second machine alignment marker. When the first substrate layer and the second substrate layer are properly aligned with each other, the first manual alignment marker is aligned with the second manual alignment marker, and the first machine alignment marker is aligned with the second machine alignment marker.

In some embodiments, the first and second manual alignment markers each have a square and the first and second machine alignment markers are each circular. In some embodiments, the first manual alignment marker is a first square and the second manual alignment marker is a second square, wherein the first square is smaller than the second square and the first square fits within the second square when the first substrate layer and the second substrate layer are properly aligned. In other embodiments, the first machine alignment marker is donut-shaped having a hole and the second machine alignment marker is a circle, wherein the circle is smaller than the hole and the circle fits within the hole when the first substrate layer and the second substrate layer are properly aligned. In some embodiments, the first portion of the alignment target area further includes a registration coupon. In this case, the registration coupon can include conductive traces formed around the first manual alignment marker and the first machine alignment marker. The conductive traces can be ITO. In some embodiments, the second portion of the alignment target area further includes an etch coupon. In this case, the etch coupon can include conductive traces formed around the second manual alignment marker and the second machine alignment marker. The conductive traces can be silver ink.

In another aspect, a method of aligning multiple substrate layers is disclosed. The method includes forming a first substrate layer having a first portion of an alignment target area formed on a surface. The first portion of the alignment target area includes a first manual alignment marker and a first machine alignment marker. The method also includes forming a second substrate layer having a second portion of the alignment target area formed on a surface. The second substrate layer is coupled to the first substrate layer. The second portion of the alignment target area includes a second manual alignment marker and a second machine alignment marker. The method also includes aligning the first substrate layer and the second substrate layer such that the first manual alignment marker is aligned with the second manual alignment marker, and the first machine alignment marker is aligned with the second machine alignment marker.

In some embodiments, the first and second manual alignment markers are each formed as squares and the first and second machine alignment markers are each circularly formed. In some embodiments, the first manual alignment marker is formed as a first square and the second manual alignment marker is formed as a second square, wherein the first square is smaller than the second square and the first square fits within the second square when the first substrate layer and the second substrate layer are properly aligned. In other embodiments, the first machine alignment marker is formed donut-shaped having a hole and the second machine alignment marker is formed as a circle, wherein the circle is smaller than the hole and the circle fits within the hole when the first substrate layer and the second substrate layer are properly aligned. In some embodiments, forming the first portion of the alignment target area further includes forming a registration coupon. In some embodiments, forming the registration coupon includes forming conductive traces around the first manual alignment marker and the first machine alignment marker. The conductive traces can be ITO. In some embodiments, forming the second portion of the alignment target area further includes forming an etch coupon. In some embodiments, forming the etch coupon includes forming conductive traces around the second manual alignment marker and the second machine alignment marker. The conductive traces can be silver ink. In some embodiments, aligning the first substrate layer and the second substrate layer such that the first manual alignment marker is aligned with the second manual alignment marker includes manually aligning the first manual alignment marker and the second manual alignment marker. In other embodiments, aligning the first substrate layer and the second substrate layer such that the first machine alignment marker is aligned with the second machine alignment marker includes machine aligning the first machine alignment marker and the second machine alignment marker.

BRIEF DESCRIPTION OF THE DRAWINGS

Several example embodiments are described with reference to the drawings, wherein like components are provided with like reference numerals. The example embodiments are intended to illustrate, but not to limit, the invention. The drawings include the following figures.

DETAILED DESCRIPTION OF THE EMBODIMENTS

Figure 1:
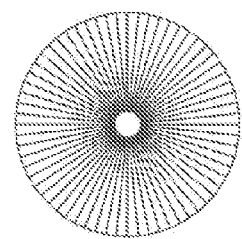
FIG. 1 illustrates a conventional printed target.

Embodiments of the present application are directed to a system and method for processing multiple layer substrates using alignment markers. Those of ordinary skill in the art will realize that the following detailed description of the system and method is illustrative only and is not intended to be in any way limiting. Other embodiments of the system and method will readily suggest themselves to such skilled persons having the benefit of this disclosure.

Reference will now be made in detail to implementations of the system and method as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Embodiments of the present application are directed to alignment markers and methods of using alignment markers to manufacture substrates having multiple layers. In an exemplary application, the alignment markers are used in the assembly of capacitive touch sensors having two layers. Subsequent discussion is directed to the manufacturing of a two layer capacitive touch sensor. It is understood that the principles described can be applied to alternative multiple-layer substrate applications. In some embodiments, each layer is made of a transparent substrate having conductive tracings on one surface. The two layers are assembled on top of each other so that the conductive tracings on each layer are separated by the thickness of at least one of the layers. In some embodiments, the conductive tracings on each layer are on opposite surfaces of the assembled layers. In some embodiments, each layer is formed of a flexible substrate, or web substrate, which is processed using roll-to-roll processing.

Manufacturing of the capacitive touch sensor includes proper alignment of the two substrate layers relative to each other. Optical alignment markers are applied at strategic, but non-obtrusive, areas of each substrate layer. Alignment markers on a first substrate layer are aligned to corresponding alignment markers on a second substrate layer. Alignment marker tolerances corresponding to alignment markers aligned on the two substrate layers are application-specific and depend in part on the substrate layer materials, conductive traces materials, and throughput rate for the assembly step. In some applications, the alignment accuracy of the alignment markers can be used as a feedback mechanism to regulate the speed of the rollers, optimize tension of the web substrate, and throughput of the roll-to-roll processing.

Groups of alignment markers are arranged in localized areas, referred to as alignment target areas, on each substrate layer. The alignment markers in a first alignment target area on the first substrate layer are to be aligned with corresponding alignment markers in a second alignment target area on the second substrate layer. In some embodiments, each alignment target area includes one or more registration coupons and/or etch coupons. Etch coupons can be used to measure correct line widths and spacing. Registration coupons can be used to test that a conductive ink has been processed properly.

Figure 2:
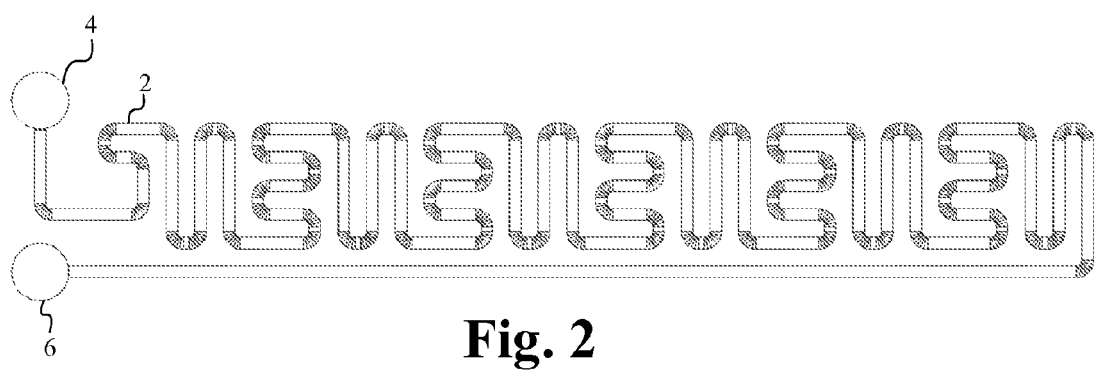
FIG. 2 illustrates an exemplary printed pattern of conductive ink, referred to as a registration coupon.

FIG. 2 illustrates an exemplary printed pattern of conductive ink, referred to as a registration coupon. In the example shown in FIG. 2, the pattern is a serpentine-like pattern 2. Other patterns can be used. The pattern is made of a conductive ink that is used in a device application, such as conductive traces in capacitive touch sensors. Registration coupons are used to test that the conductive ink has dried, or cured, and conducts properly. The registration coupon has a known total length and width from which is expected a known electrical resistance. When the conductive ink dries properly, it has a resulting electrical resistance, or range of electrical resistance that matches the expected electrical resistance. To test, wire probe tips are applied to each of the two test pads 4 and 6 and the total electrical resistance is measured. This measured electrical resistance is compared to the designed electrical resistance corresponding to the coupon length and width dimensions.

Figure 3:
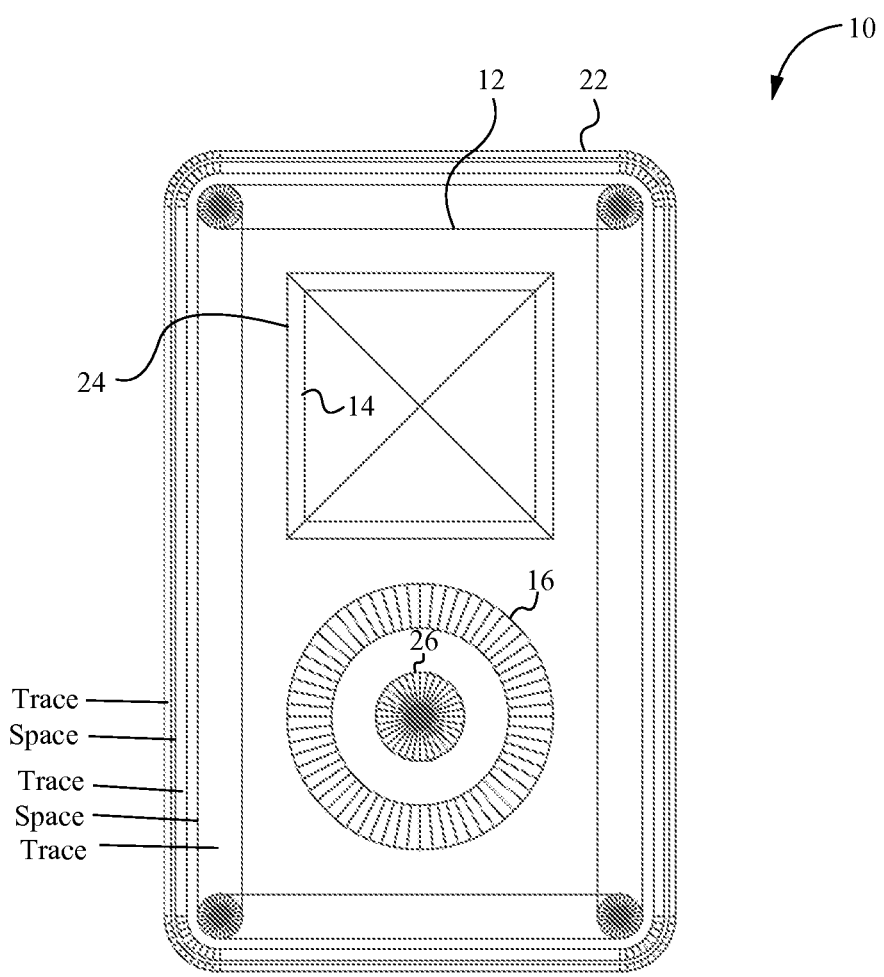
FIG. 3 illustrates a top down view of an alignment target area including two pairs of alignment markers in alignment according to an embodiment.
Figure 4:
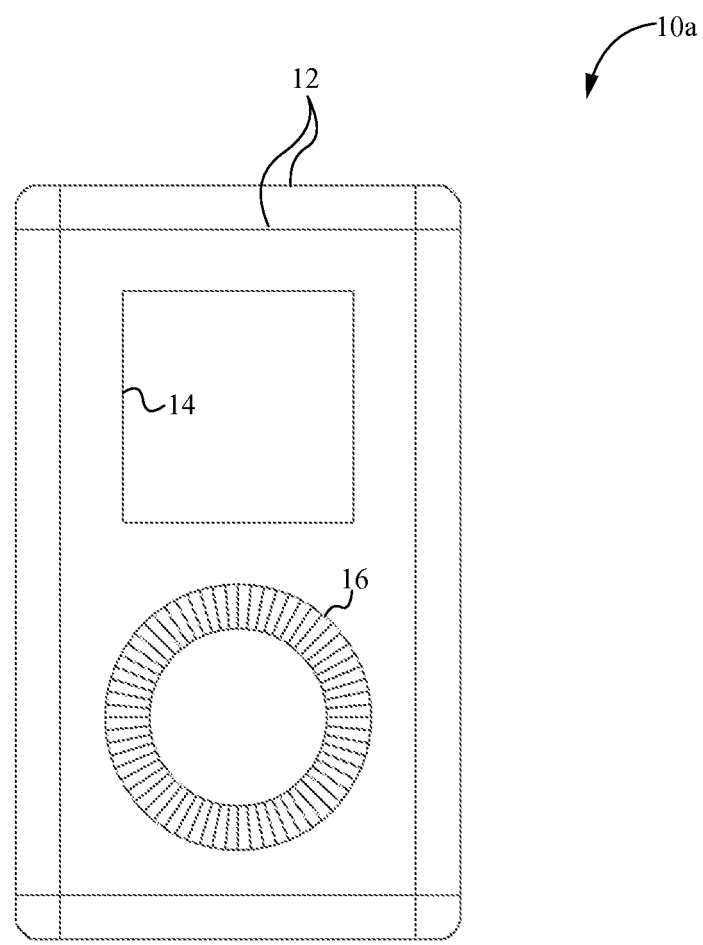
FIG. 4 illustrates the portion of the alignment target area of FIG. 3 corresponding to a first substrate layer.
Figure 5:
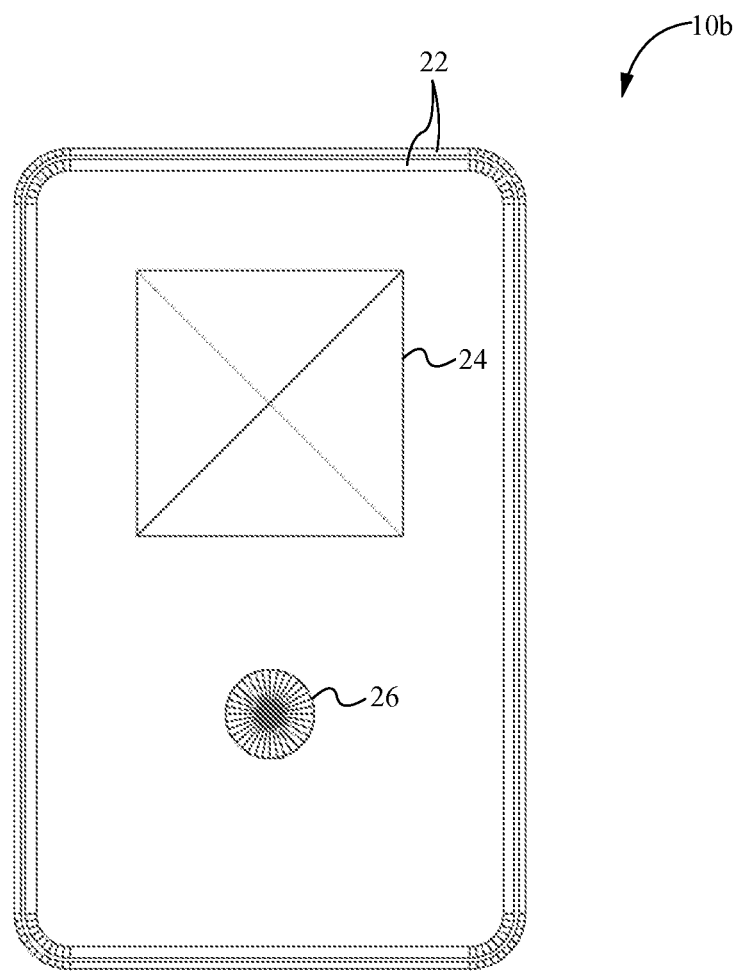
FIG. 5 illustrates the portion of the alignment target area of FIG. 3 corresponding to a second substrate layer.

FIG. 3 illustrates a top down view of an alignment target area 10 including two pairs of alignment markers in alignment according to an embodiment. In this exemplary embodiment, the alignment target area 10 corresponds to two aligned substrate layers. FIG. 4 illustrates the portion of the alignment target area of FIG. 3 corresponding to a first substrate layer. FIG. 5 illustrates the portion of the alignment target area of FIG. 3 corresponding to a second substrate layer. The alignment target area portion 10a on the first substrate layer includes a border 12, inner square marker 14 and donut-shaped marker 16. In some embodiments, the border 12 functions as a registration coupon, the electrical resistance of which can be measured. In other embodiments, the border 12 functions as a visual aide for defining an area of the alignment target area portion 10a. The alignment target area portion 10b on the second substrate layer includes an etch coupon 22, an outer square marker 24, and a dot marker 26. The etch coupon 22 can include one or more traces separated by spaces, each trace and space having a distinct width. The etch coupon can be used to measure correct line widths and spacing.

In some embodiments, the border 12, the inner square marker 14, and the donut-shaped marker 16 are made of silver ink, and the etch coupon 22, the outer square marker 24 and the dot marker 26 are made of ITO (indium tin oxide). It is understood that alternative conductive materials can be used. It is also understood that the components of the alignment target area can be made of non-conductive material.

The markers 14, 16, 24, and 26 are used as a feedback registration mechanism. In some embodiments, the inner square marker 14 and the outer square marker 24 are used for human readable registration feedback, also referred to as manual alignment. The relative size of the smaller square marker 14 to the larger square marker 24 is designed according to a tolerance of the alignment process and can be adjusted according to the application. When one side of the inner square marker 14 migrates to the edge of the larger square marker 24, this is the limit of the allowable registration tolerance.

In some embodiments, the donut-shaped marker 16 and the dot marker 26 are used for machine readable registration feedback, also referred to a machine alignment. The donut-shaped marker 16 and the dot marker 26 server a similar function as the inner and outer square markers 14 and 24, but the donut-shaped marker 16 and the dot marker 26 are intended for optical registration equipment. Such equipment is more successful at locating a center of a circle than at locating a center of a square, whereas anecdotally human operators prefer using a square. It is understood that alternatively shaped markers can be used for manual and machine alignment. The relative size of the dot marker 26 to the donut-shaped marker 16 is designed according to the tolerance of the alignment process and can be adjusted according to the application.

The alignment markings are manufacturing aides used by humans, machines, or both to optically identify pairs of alignment markings on two substrate layers to be layered, and to verify that the two substrate layers are aligned. The alignment markers can be used to initially align the layers or to verify alignment from a previous step. The two substrate layers are assembled such that the surfaces having the conductive patterns are not facing each other. For example, a first substrate layer has a top, or first, surface and a bottom, or second, surface, where the conductive traces of the capacitive touch sensor and the alignment target area are printed on the first surface, and a second substrate layer also has a first surface and a second surface, wherein the conductive traces of the capacitive touch sensor and the alignment target area are printed on the first surface. In one exemplary configuration, the second layer of the first substrate layer is positioned on the second surface of the second substrate layer. Alternatively, the second surface of the first substrate layer can be positioned on the first surface of the second substrate layer, or the first surface of the first substrate layer can be positioned on the second surface of the second substrate layer.

The present application has been described in terms of specific embodiments incorporating details to facilitate the understanding of the principles of construction and operation of the system and method for processing multiple layer substrates using alignment markers. Many of the components shown and described in the various figures can be interchanged to achieve the results necessary, and this description should be read to encompass such interchange as well. As such, references herein to specific embodiments and details thereof are not intended to limit the scope of the claims appended hereto. It will be apparent to those skilled in the art that modifications can be made to the embodiments chosen for illustration without departing from the spirit and scope of the application.

What is claimed:

1. An alignment feedback apparatus for aligning multiple substrate layers, the apparatus comprising:
    a. a first substrate layer having a first portion of an alignment target area formed on a surface, wherein the first portion of the alignment target area includes a first manual alignment marker and a first machine alignment marker, further wherein the first portion of the alignment target area further includes a registration coupon; and
    b. a second substrate layer having a second portion of the alignment target area formed on a surface, the second substrate layer coupled to the first substrate layer, wherein the second portion of the alignment target area includes a second manual alignment marker and a second machine alignment marker, wherein when the first substrate layer and the second substrate layer are properly aligned with each other, the first manual alignment marker is aligned with the second manual alignment marker, and the first machine alignment marker is aligned with the second machine alignment marker.

2. The apparatus of claim 1 wherein the first and second manual alignment markers each comprise a same outer perimeter shape and the first and second machine alignment markers each comprise a same outer perimeter shape.

3. The apparatus of claim 2 wherein the first manual alignment marker comprises a first square and the second manual alignment marker comprises a second square, wherein the first square is smaller than the second square and the first square fits within the second square when the first substrate layer and the second substrate layer are properly aligned.

4. The apparatus of claim 2 wherein the first machine alignment marker is donut-shaped having a hole and the second machine alignment marker comprises a circle, wherein the circle is smaller than the hole and the circle fits within the hole when the first substrate layer and the second substrate layer are properly aligned.

5. The apparatus of claim 1 wherein the second portion of the alignment target area further comprises an etch coupon.

6. The apparatus of claim 5 wherein the etch coupon comprises conductive traces formed around the second manual alignment marker and the second machine alignment marker.

7. The apparatus of claim 6 wherein the conductive traces comprise silver ink.

8. The apparatus of claim 1 wherein the registration coupon comprises conductive traces formed around the first manual alignment marker and the first machine alignment marker.

9. The apparatus of claim 8 wherein the conductive traces comprise ITO.

10. The apparatus of claim 1 wherein the first manual alignment marker has a different shape than the first machine alignment marker, and the second manual alignment marker has a different shape than the second machine alignment marker.

11. A method of aligning multiple substrate layers, the method comprising:
 a. forming a first substrate layer having a first portion of an alignment target area formed on a surface, wherein the first portion of the alignment target area includes a first manual alignment marker and a first machine alignment marker, further wherein the first portion of the alignment target area further includes a registration coupon;
 b. forming a second substrate layer having a second portion of the alignment target area formed on a surface, the second substrate layer coupled to the first substrate layer, wherein the second portion of the alignment target area includes a second manual alignment marker and a second machine alignment marker; and
 c. aligning the first substrate layer and the second substrate layer such that the first manual alignment marker is aligned with the second manual alignment marker, and the first machine alignment marker is aligned with the second machine alignment marker.

12. The method of claim 11 wherein the first and second manual alignment markers are each formed with a same outer perimeter shape and the first and second machine alignment markers are each formed with a same outer perimeter shape.

13. The method of claim 11 wherein forming the registration coupon comprises forming conductive traces around the first manual alignment marker and the first machine alignment marker.

14. The method of claim 11 wherein forming the second portion of the alignment target area further comprises forming an etch coupon.

15. The method of claim 11 wherein aligning the first substrate layer and the second substrate layer such that the first manual alignment marker is aligned with the second manual alignment marker comprises manually aligning the first manual alignment marker and the second manual alignment marker.

16. The method of claim 11 wherein aligning the first substrate layer and the second substrate layer such that the first machine alignment marker is aligned with the second machine alignment marker comprises machine aligning the first machine alignment marker and the second machine alignment marker.

17. The method of claim 12 wherein the first manual alignment marker is formed as a first square and the second manual alignment marker is formed as a second square, wherein the first square is smaller than the second square and the first square fits within the second square when the first substrate layer and the second substrate layer are properly aligned.

18. The method of claim 12 wherein the first machine alignment marker is formed donut-shaped having a hole and the second machine alignment marker is formed as a circle, wherein the circle is smaller than the hole and the circle fits within the hole when the first substrate layer and the second substrate layer are properly aligned.

19. The method of claim 13 wherein the conductive traces comprise ITO.

20. The method of claim 14 wherein forming the etch coupon comprises forming conductive traces around the second manual alignment marker and the second machine alignment marker.

21. The method of claim 20 wherein the conductive traces comprise silver ink.

22. An alignment feedback apparatus for aligning multiple substrate layers, the apparatus comprising:
 a. a first substrate layer having a first portion of an alignment target area formed on a surface, wherein the first portion of the alignment target area includes a first manual alignment marker and a first machine alignment marker; and
 b. a second substrate layer having a second portion of the alignment target area formed on a surface, the second substrate layer coupled to the first substrate layer, wherein the second portion of the alignment target area includes a second manual alignment marker and a second machine alignment marker, further wherein the second portion of the alignment target area further includes an etch coupon, wherein when the first substrate layer and the second substrate layer are properly aligned with each other, the first manual alignment marker is aligned with the second manual alignment marker, and the first machine alignment marker is aligned with the second machine alignment marker.

23. The apparatus of claim 22 wherein the first and second manual alignment markers each comprise a same outer perimeter shape and the first and second machine alignment markers each comprise a same outer perimeter shape.

24. The apparatus of claim 23 wherein the first manual alignment marker comprises a first square and the second manual alignment marker comprises a second square, wherein the first square is smaller than the second square and the first square fits within the second square when the first substrate layer and the second substrate layer are properly aligned.

25. The apparatus of claim 23 wherein the first machine alignment marker is donut-shaped having a hole and the second machine alignment marker comprises a circle, wherein the circle is smaller than the hole and the circle fits within the hole when the first substrate layer and the second substrate layer are properly aligned.

26. The apparatus of claim 22 wherein the etch coupon comprises conductive traces formed around the second manual alignment marker and the second machine alignment marker.

27. The apparatus of claim 26 wherein the conductive traces comprise silver ink.

28. The apparatus of claim 22 wherein the first manual alignment marker has a different shape than the first machine alignment marker, and the second manual alignment marker has a different shape than the second machine alignment marker.

29. A method of aligning multiple substrate layers, the method comprising:
   a. forming a first substrate layer having a first portion of an alignment target area formed on a surface, wherein the first portion of the alignment target area includes a first manual alignment marker and a first machine alignment marker;
   b. forming a second substrate layer having a second portion of the alignment target area formed on a surface, the second substrate layer coupled to the first substrate layer, wherein the second portion of the alignment target area includes a second manual alignment marker and a second machine alignment marker, further wherein the second portion of the alignment target area further includes an etch coupon; and
   c. aligning the first substrate layer and the second substrate layer such that the first manual alignment marker is aligned with the second manual alignment marker, and the first machine alignment marker is aligned with the second machine alignment marker.

30. The method of claim 29 wherein the first and second manual alignment markers are each formed with a same outer perimeter shape and the first and second machine alignment markers are each formed with a same outer perimeter shape.

31. The method of claim 30 wherein the first manual alignment marker is formed as a first square and the second manual alignment marker is formed as a second square, wherein the first square is smaller than the second square and the first square fits within the second square when the first substrate layer and the second substrate layer are properly aligned.

32. The method of claim 30 wherein the first machine alignment marker is formed donut-shaped having a hole and the second machine alignment marker is formed as a circle, wherein the circle is smaller than the hole and the circle fits within the hole when the first substrate layer and the second substrate layer are properly aligned.

33. The method of claim 29 wherein forming the etch coupon comprises forming conductive traces around the second manual alignment marker and the second machine alignment marker.

34. The method of claim 33 wherein the conductive traces comprise silver ink.

35. The method of claim 29 wherein aligning the first substrate layer and the second substrate layer such that the first manual alignment marker is aligned with the second manual alignment marker comprises manually aligning the first manual alignment marker and the second manual alignment marker.

36. The method of claim 29 wherein aligning the first substrate layer and the second substrate layer such that the first machine alignment marker is aligned with the second machine alignment marker comprises machine aligning the first machine alignment marker and the second machine alignment marker.

* * * * *